United States Patent [19]

Teraoka et al.

[11] Patent Number: 5,317,529

[45] Date of Patent: May 31, 1994

[54] DIGITAL FILTER USING INTERMEDIATE HOLDING REGISTERS AND COMMON ACCUMULATORS AND MULTIPLIERS

[75] Inventors: Eiichi Teraoka; Toru Kengaku, both of Itami; Hiroichi Ishida, Amagasaki, all of Japan

[73] Assignee: Mitsubishi Denki Kabushiki Kaisha, Tokyo, Japan

[21] Appl. No.: 859,208

[22] Filed: Mar. 27, 1992

[30] Foreign Application Priority Data

Apr. 23, 1991 [JP] Japan ................................. 3-091892

[51] Int. Cl.$^5$ ............................................. G06F 15/31
[52] U.S. Cl. .................................. 364/724.1; 341/108
[58] Field of Search ..................... 364/724.1; 341/108, 341/110

[56] References Cited

U.S. PATENT DOCUMENTS

| | | | |
|---|---|---|---|
| 4,766,561 | 8/1988 | Thompson et al. | 364/724.13 |
| 4,881,191 | 11/1989 | Morton | 364/724.1 |
| 4,931,972 | 6/1990 | Obata et al. | 364/724.13 |
| 4,937,577 | 6/1990 | Rich et al. | 364/724.1 |
| 4,972,360 | 11/1940 | Cukier et al. | 364/724.1 |
| 4,972,436 | 11/1990 | Halim et al. | 364/724.1 |
| 5,126,961 | 6/1992 | Garverick | 364/724.1 |
| 5,157,395 | 10/1992 | Signore et al. | 364/724.1 |

OTHER PUBLICATIONS

IEEE JSSC vol. Sc-21 #3 Jun. 1987 Naus et al., "A CMOS Stereo 16-bit D/A Converter for Digital Audio", p. 390.
IEEE JSSC vol. 24 #2 Apr. 1989, Norsworthy et al., "A 14-bit 80 kHz Sigma-Delta A/D Converter: Modeling, Design & Performance Evaluation," pp. 258–259, D. Digital Filtering Decimation.
Nikkei Electronics #458 pp. 223–231, Oct. 17, 1988 "A-D/D-A Converting Techniques of Oversampling Type".

Primary Examiner—David H. Malzahn
Attorney, Agent, or Firm—Townsend and Townsend Khourie and Crew

[57] ABSTRACT

An A/D-D/A converting apparatus, in which a multiplier is omitted by storing the multiplied result of a filter coefficient and a digital signal in advance and reading it out responsive to the inputted digital signal, in view of the point that filter characteristics of digital filters of an A/D converting unit and a D/A converting unit are equal one another, memories which are coefficient generating devices are used in common, and further, in view of the point that processing contents of respective digital filters are equal, a multiplier and an accumulator constituting the digital filter are used in common to reduce a circuit configuration considerably.

3 Claims, 4 Drawing Sheets

DIGITAL FILTER USING INTERMEDIATE HOLDING REGISTERS AND COMMON ACCUMULATORS AND MULTIPLIERS

BACKGROUND OF THE INVENTION

1. Field of the Invention

The present invention relates to an A/D-D/A converting apparatus having an A/D converting unit and a D/A converting unit, each using digital filters.

2. Description of the Prior Art

A conventional configuration of an A/D-D/A converting apparatus having both an A/D converting unit and a D/A converting unit each using digital filters is shown in a block diagram of FIG. 1.

In FIG. 1, numeral 1 designates an A/D conversion unit and numeral 2 designates an D/A conversion unit. Numeral 3 designates an input terminal of an analog input signal to the A/D conversion unit 1, numeral 4 designates an output terminal of a digital output signal from the A/D conversion unit 1, numeral 5 designates an input terminal of a digital input signal to the D/A conversion unit 2, and numeral 6 designates an output terminal of an analog output signal from the D/A conversion unit 2.

An internal configuration of A/D conversion unit 1 is as follows.

Analog input signals input at the analog input signal input terminal 3 are first input to an A/D converter 7. The A/D converter 7 is an oversampling type A/D converter which converts the analog input signal, whose sampling frequency is fs into a digital signal 8 whose oversampling frequency is a·fs (where, a=2, 3 . . . ), and outputs to a first decimation filter 9.

The first decimation filter 9 converts the digital signal 8 output from the A/D converter 7 and having the oversampling frequency a·fs into a digital signal 10 of sampling frequency b·fs (where, b<a, b=1, 2 . . . ) and outputs to a second decimation filter 11, and at the same time, functions as a first digital filter (M taps) which removes folding noises generated at conversion. Numeral 17 designates a coefficient generating device which generates a coefficient for deciding characteristics of the first decimation filter 9.

The second decimation filter 11 converts the digital signal 10 output from the first decimation filter 9 having the sampling frequency b·fs into the digital signal having the sampling frequency fs, and outputs the digital signal at output terminal 4, and at the same time, functions as a second digital filter (N taps) which removes folding noises generated at conversion. Numeral 18 designates a coefficient generating device which generates a coefficient for deciding characteristics of the second decimation filter 11.

An internal configuration of the D/A conversion unit 2 is as follows.

Digital input signals input at the digital signal input terminal 5 are first input to a first interpolation filter 16. The first interpolation filter 16 converts the digital input signal whose sampling frequency is fs into a digital signal 15 whose oversampling frequency is c·fs (where, c=1, 2 . . . ), and outputs to a second interpolation filter 14, and at the same time, functions as a third digital filter (N taps) which removes image components generated at conversion. Numeral 20 designates a coefficient generating device which generates a coefficient for deciding characteristics of the first interpolation filter 16.

The second interpolation filter 14 converts the digital signal 15 outputted from the first interpolation filter 16 and having the sampling frequency c·fs into a digital signal 13 whose sampling frequency is d·fs (where, d>c, d=2, 3 . . . ), and outputs the signal to the D/A converter 12, and at the same time, functions as a fourth digital filter (M taps) which removes image components generated at conversion. Numeral 19 designates a coefficient generating device which generates a coefficient for deciding characteristics of the second interpolation filter 14.

The D/A converter 12 is an oversampling type D/A converter which converts the digital signal 13 output from the second interpolation filter 14 and having the sampling frequency of d·fs into the analog signal, and outputs the analog signal to output terminal 6.

The first decimation filter 9, second decimation filter 11, first interpolation filter 16 and second interpolation filter 14, which are the first, second, third and fourth digital filters are all implemented as FIR (Finite Impulse Response) type digital filters.

Next, the operation of the conventional A/D-D/A converting apparatus thus constituted is described.

First, the operation of the A/D conversion unit 1 is described.

The analog input signal input to the A/D conversion unit 1 from the analog signal input terminal 3 is converted into the digital signal 8 of sampling frequency a·fs by the oversampling type A/D converter 7. However, the digital output signal output from the digital signal output terminal 4 must be eventually converted into the sampling frequency fs. Conversion of the sampling frequency for this purpose is a subsampling process, which is, specifically, a relatively simple process wherein digital data are only output at an interval of 1/a. However, there is a high possibility that the folding noises mix into the signal to deteriorate the accuracy of signal considerably, when it is processed simply by subsampling. Therefore, the subsampling process is performed after removing the noises by passing the digital signal through the digital filter.

The digital filter used for such a purpose should satisfy the following two conditions (a) and (b).

(a) In order to prevent folding noises, it should have a sufficient attenuation in region where there are folding noises.

(b) It should have signal passing characteristics which are as flat as possible in a signal band.

It is very difficult to realize such filter characteristics by a single stage digital filter, because a Nyquist frequency of the input signal and a frequency in the signal band are relatively separated. And hence, usually, a two-stage configuration of the first digital filter (first decimation filter 9) and the second digital filter (second decimation filter 11) is adopted as the digital filter.

The conventional A/D-D/A converting apparatus whose configuration is shown in FIG. 1 has digital filters with such two-stage configurations to convert the sampling frequency. That is, the digital signal 8 output from the A/D converter 7 is first converted into the digital signal 10 of an intermediate sampling frequency b·fs by passing through the first decimation filter 9 which is the first digital filter (M taps) at the sampling frequency a·fs to subsample the sample data. Thereafter, components such as noises still in the vicinity of the signal band are further removed by the second decimation filter 11 which is the second digital filter (N taps) of a higher accuracy, to subsample the data to the final sampling frequency fs.

Filter characteristics of the above-mentioned first decimation filter 9 and second decimation filter 11, which are the first and second digital filters, are decided respectively by the coefficient generating devices 17 and 18.

Next, the operation of D/A conversion unit 2 is described.

D/A conversion unit 2 basically operates in the opposite way of A/D conversion unit 1. Though the conversion takes place in A/D conversion unit 1 by thinning the sampling frequency from a·fs to fs, in D/A conversion unit 2, the sampling frequency is, conversely, interpolated from fs to d·fs for conversion. Moreover, when the sampling frequency is converted into d·fs from fs in D/A conversion unit 2, it is passed through the digital filter to remove out-of-band signal noises as is the case with A/D conversion unit 1.

The digital filter used for such purpose should satisfy the following two conditions (c) and (d).

(c) In order to remove the image noises generated by interpolation, a sufficient attenuation is necessary in the filter characteristics in the region where there are image noises.

(d) It should have signal passing characteristics which are as flat as possible in a signal band.

Hereupon, from the fact that the conditions (c) and (d) are substantially quite similar to the conditions (a) and (b) associated with the filter for the subsampling process mentioned above, a two-stage configuration having the entirely same characteristics as the decimating filter is generally adopted in the interpolating filter.

That is, the digital signal of sampling frequency fs input from the digital signal input terminal 5 is first interpolated by the first interpolation filter 16, which is the third digital filter (N taps), and converted into a digital signal 15 of sampling frequency c·fs. Next, the digital signal 15 is interpolated by the second interpolation filter 14 which is the fourth digital filter (M taps) and converted into the sampling frequency d·fs, thereafter, the image noises are removed and it turns into a digital signal 13. The digital signal 13 with a sampling frequency of d·fs is converted into the analog signal by the oversampling type D/A converter 12, and output from the analog signal output terminal 6 of the D/A conversion unit 2.

FIG. 2 is a block diagram showing a general configuration which is common to the first decimation filter 9, second decimation filter 11, first interpolation filter 16 and second interpolation filter 14 which are the first, second, third and fourth digital filters.

In FIG. 2, numeral 40 designates a memory, into which digital input signals to respective filters are input and data for each tap of the filters are stored. Numeral 41 designates a memory, which stores filter characteristics of the filters and corresponds to the coefficient generating devices 17, 18, 19 and 20 in FIG. 1. Data stored in the memories 40 and 41 are given to a multiplier 42, whose calculation results are given to an accumulator 43.

By such a configuration, the sum of product operations or filter operations are performed in the digital filters.

The data capacity of memory 40 into which the digital signal is input differs with respective filters, that is, it is M words in the first decimation filter 9, which is the first digital filter, N words in the second decimation filter 11, which is the second digital filter, N/c words in the first interpolation filter 16, which is the third digital filter and Mc/d words in the second interpolation filter 14, which is the fourth digital filter.

The conventional oversampling type A/D-D/A converting apparatus as stated above is particularly disclosed in "A-D/D-A Conversion Techniques of Oversampling Type" (Nikkei Electronics, No. 458, pp. 223-231, Oct. 17, 1988).

Now, since the conventional A/D-D/A converting apparatus employs the configuration as stated above, the 4-stage digital filters from the first to fourth stages are needed, and the coefficient generating devices and the multipliers for multiplying the coefficient and digital data are necessary for the respective digital filters. Thus, there is a problem that the circuit required to implement the entire apparatus is considerably large.

In view of such circumstances, the inventor has proposed the invention which was previously disclosed in Japanese Patent Application Laid-Open No. 3-41826 (1991).

An embodiment of the invention disclosed in the Japanese Patent Application Laid-Open No. 3-41826 (1991) is shown in block diagram as FIG. 3. Similar reference characters in FIG. 1 and FIG. 3 designate similar component members therein.

The embodiment of Japanese Patent Application Laid-Open No. 3-41826 (1991) shown in FIG. 3 has been devised in view of the fact that, frankly speaking, the filter characteristics of the first decimation filter 9 in the A/D converting unit 1 shown in FIG. 1, which is the first digital filter, and the second interpolation filter 14 in D/A conversion unit 2, which is the fourth digital filter, are common, and the filter characteristics of the second decimation filter 11 in A/D conversion unit 1, which is the second digital filter and the first interpolation filter 16 in D/A conversion unit 2, which is the third digital filter, are common. That is, the coefficient generating devices 17 and 19 in FIG. 1 are replaced with a coefficient generating device 37 in FIG. 3, and the coefficient generating devices 18 and 20 are replaced with a coefficient generating device 38 in FIG. 3.

However, even in the aforesaid invention of Japanese Patent Application Laid-Open No. 3-41826 (1991), the coefficient generating devices are only reduced to four from two, thus it is not too much to say that little contribution is made for reducing the circuit configuration.

SUMMARY OF THE INVENTION

The present invention has been devised in view of such circumstances, therefore, it is a primary object thereof to provide an A/D-D/A converting apparatus which is capable of reducing the size of a circuit required to implement the apparatus considerably.

As a configuration of an oversampling type A/D converter, a $\Delta$ modulator and a $\Delta\Sigma$ modulator are considered. A MASH (MultistAge Noise SHaping) type converter which is capable of compensating for problems of a multistage $\Delta\Sigma$ modulator and obtaining the same performance as the modified $\Delta\Sigma$ modulator. Digital output signals of the $\Delta$ modulator and $\Delta\Sigma$ modulator are 1 bit, and though the digital output signal of the MASH type converter differs in the number of stages it has, for example, in the case of 3 stages, it is 3 bits, which is relatively low. Thus, in the A/D-D/A converting apparatus according to the present invention, by taking notice of the low number of bits in the digital output signal of the A/D converter, the apparatus can use a preempted table to get the multiplied results of a filter coefficient and a digital output signal which can be read out responsive to the input digital signal, eliminating the need for a multiplier.

Meanwhile, in view of the point that filter characteristics of the digital filters in the A/D conversion unit and the D/A conversion unit are equal to one another, the coefficient generating units can use common lookup memories, and furthermore, in view of the point that the processing contents of the digital filters are equal, the multipliers and accumulators constituting the digital filters are used in common. Thus, in the A/D-D/A converting apparatus according to the present invention, the multiplied result of the signal and a filter coefficient is output from the memory and accumulated responsive to the input digital signal, and each one multiplier and accumulator are used in common in the operation of plural digital filters.

The above and further objects and features of the invention will more fully be apparent from the following detailed description with accompanying drawings.

DESCRIPTION OF THE PREFERRED EMBODIMENT

In the following, one embodiment of the present invention is particularly described with reference to the drawings.

Figure 4:
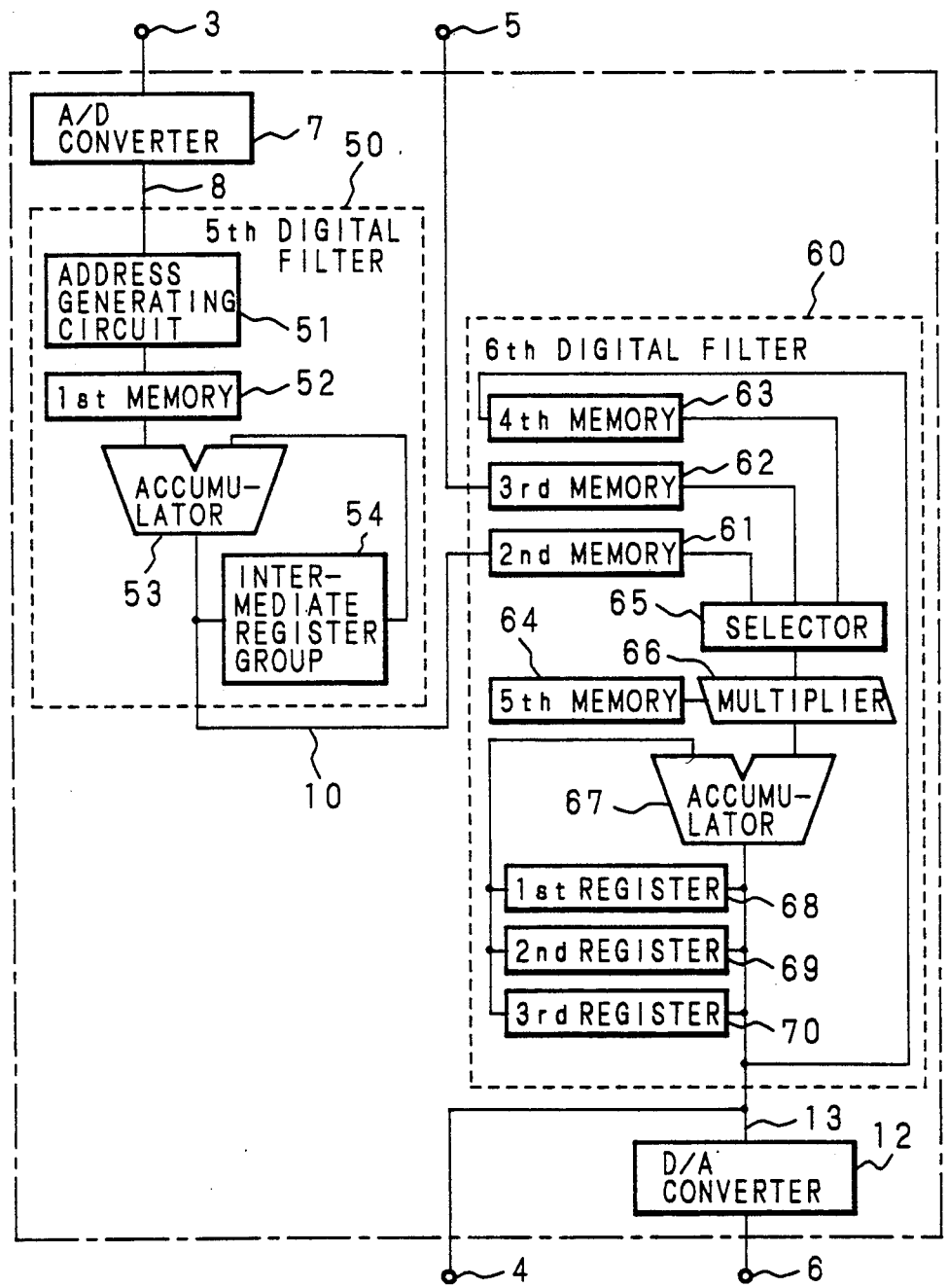
FIG. 4 is a block diagram showing an embodiment of an A/D-D/A converting apparatus according to the present invention.

In FIG. 4, numeral 3 designates an input terminal of an analog input signal to the A/D-D/A converting apparatus of the present invention, numeral 4 designates an output terminal of a digital output signal from the A/D-D/A converting apparatus of the present invention, numeral 5 designates an input terminal of a digital input signal to the A/D-D/A converting apparatus of the present invention, and numeral 6 designates an output terminal of an analog output signal from the A/D-D/A converting apparatus of the present invention.

The analog input signal input from the analog signal input terminal 3 is first given to an A/D converter 7. A/D converter 7 is an oversampling type A/D converter, which converts the analog input signal, whose sampling frequency is fs, into a digital signal 8 whose oversampling frequency is a·fs (where, a=2, 3 ...), and outputs it to a fifth digital filter 50.

The fifth digital filter 50 converts the digital signal 8 output from the A/D converter 7 and having the oversampling frequency a·fs into a digital signal 10 of sampling frequency b·fs (where, b<a, b=1, 2, ... ) and outputs the signal to a sixth digital filter 60, and at the same time, functions as a first digital filter (M taps) which removes folding noises generated at conversion.

The fifth digital filter 50 is a digital filter which performs the operation corresponding to the first digital filter, or the conventional first decimation filter 9 as stated above, and comprises an address generating circuit 51, a first memory 52, an accumulator 53, and an intermediate register group 54.

Figure 2:
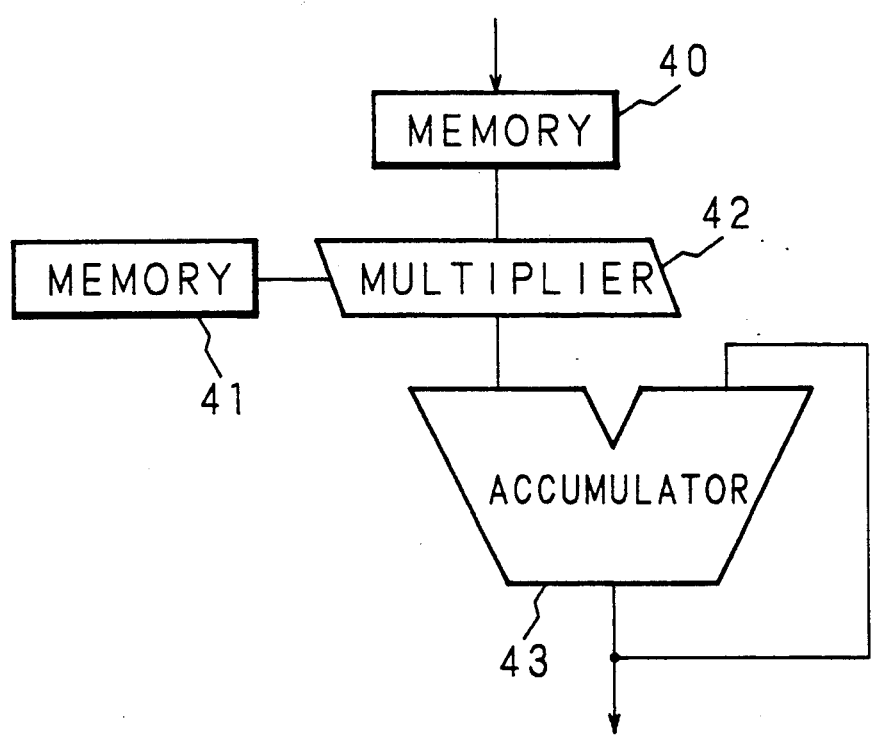
FIG. 2 is a block diagram showing an internal configuration of respective digital filters.
Figure 3:
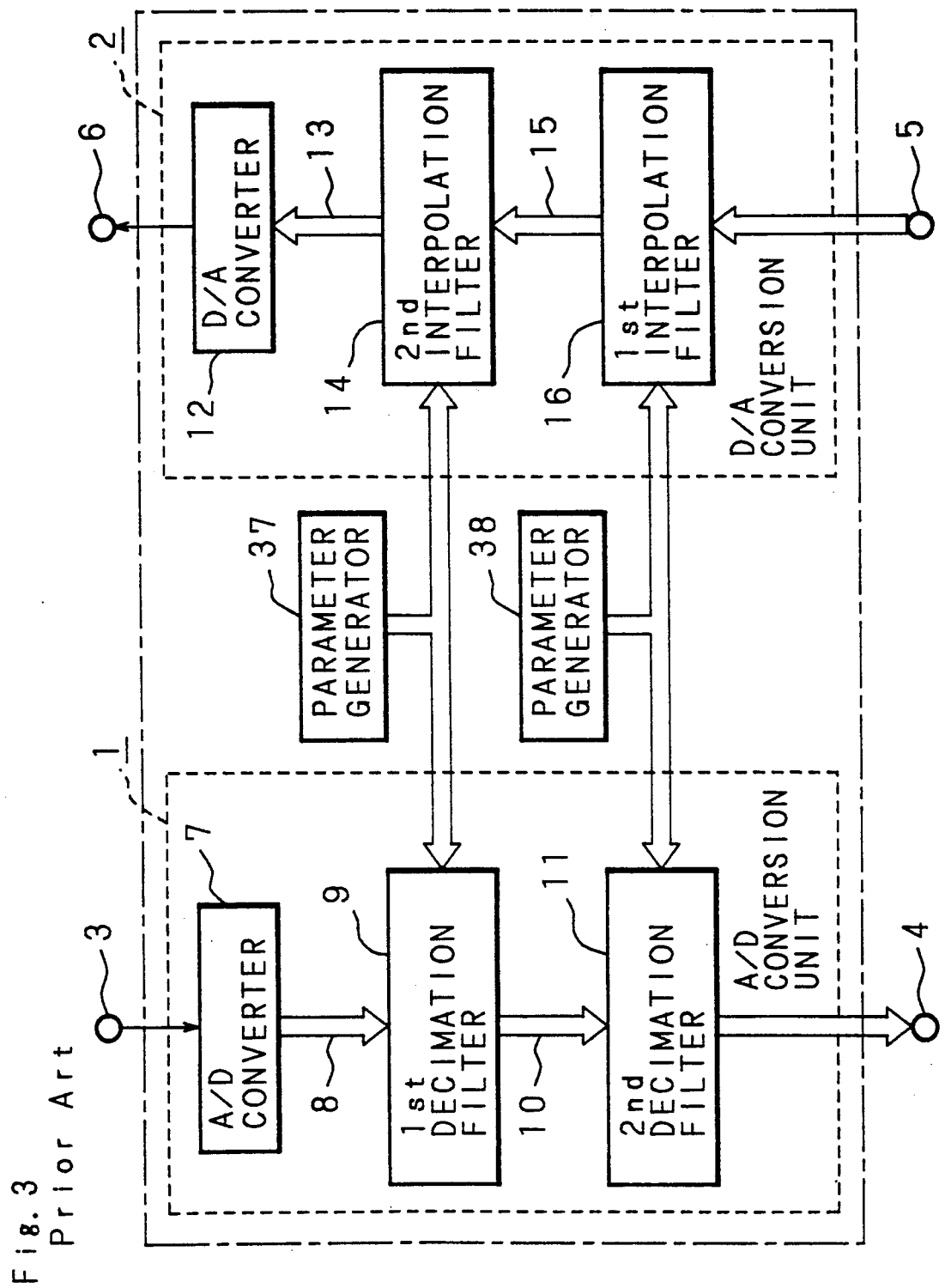
FIG. 3 is a block diagram showing a conventional configuration of an A/D-D/A converting apparatus in which coefficient generating devices of the digital filters in FIG. 1 are used in common.

The first memory 52 stores a product of data of the digital signal 8 output from the A/D converter 7 and a filter coefficient, which was previously provided by the multiplier 42, by using the hardware in FIG. 2 to premultiply in advance. That is, since the digital signal 8 output from the oversampling type A/D converter 7 using the Δ modulator and the ΔΣ modulator comprises relatively low bit data of 1 to 3 bits, it is possible to store the multiplied result of this input data and the filter coefficient (M words) in advance, in a memory of relatively small capacity of about M to $2^3$ M words. When M is about 128, less hardware is needed (and the area needed on a chip is smaller) by using an ROM of $2^3$ M words, or 1024 words, than if a multiplier were used.

Thus, a multiply, as would be done by the multiplier, is possible, when the address of the first memory 52 is generated by the address generating circuit 51 responsive to the input digital signal 8 and the multiplied result of data of the digital signal 8 which is stored in the first memory 52 in advance, and the filter coefficient of the first digital filter is output to the accumulator 53.

Meanwhile, the intermediate register group 54 is used in place of the memory 40 in FIG. 2 which is for storing input data of M words. This is because that, since data are subsampled to 1/a in the fifth digital filter 50, the sum of products operation (filter coefficient X input data) may be performed by M/a times for one input data.

Figure 1:
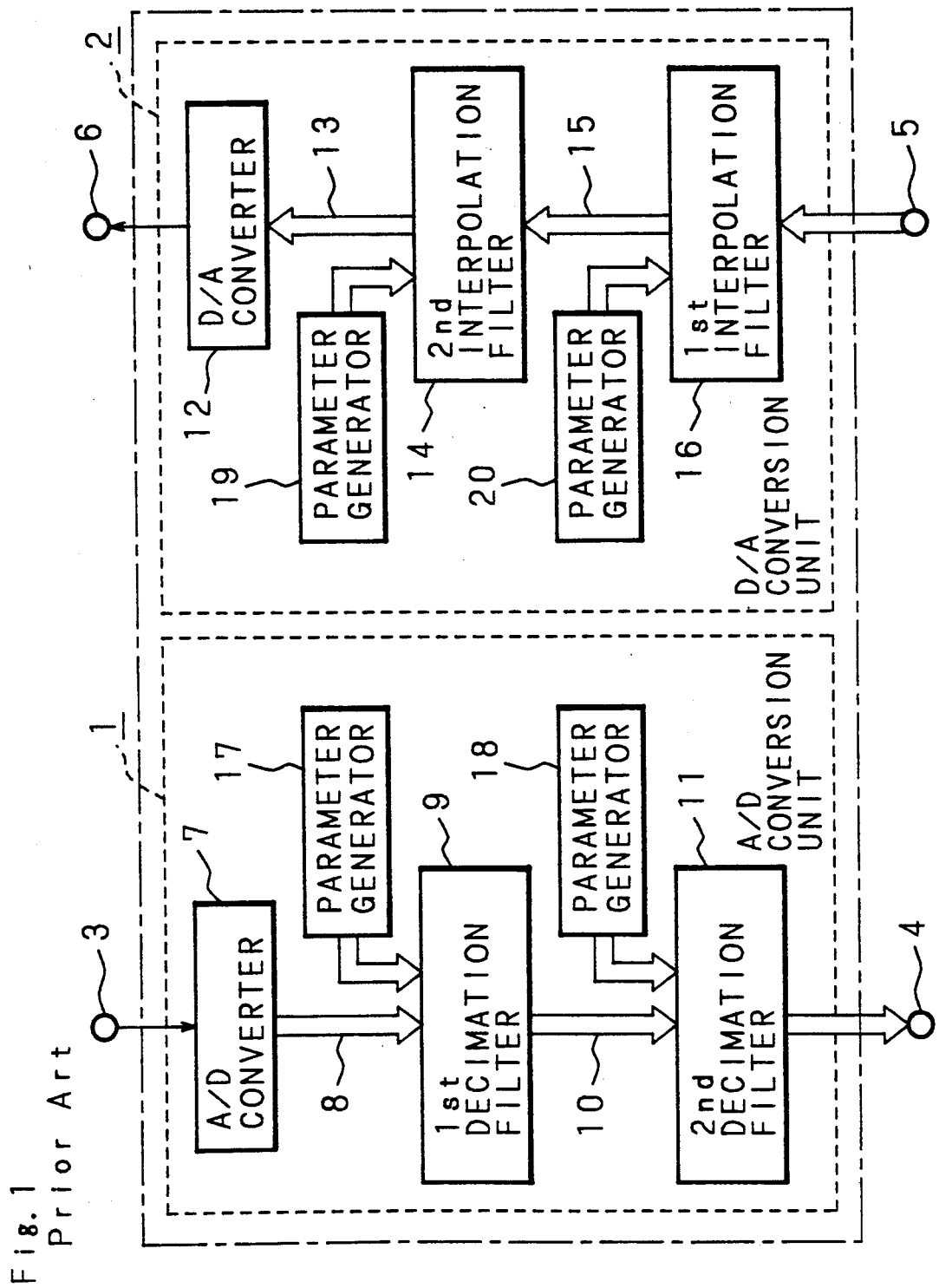
FIG. 1 is a block diagram showing a conventional configuration of an A/D-D/A converting apparatus having an A/D conversion unit and a D/A conversion unit each using digital filters.

The sixth digital filter 60 performs the operation corresponding to the second, third and fourth digital filters, or the second decimation filter 11, first interpolation filter 16 and second interpolation filter 14 of the conventional example shown in FIG. 1.

The sixth digital filter 60 converts the digital signal 10 output from the fifth digital filter 50 and having the sampling frequency of b·fs into a digital signal with a sampling frequency of fs and outputs it to the digital signal output terminal 4, and at the same time, functions as a second digital filter (N taps) which removes folding noises generated at conversion. Moreover, the sixth digital filter 60 converts the digital input signal input from the digital signal input terminal 5 and having the sampling frequency of fs into a digital signal 15 whose sampling frequency is c·fs (where, c=1, 2 ... ), and at the same time, functions as a third digital filter (N taps) which removes image components generated at conversion. The sixth digital filter 60 also converts the digital signal whose sampling frequency is c·fs into a digital signal 13 whose sampling frequency is d·fs (where, d>c, d=2, 3 ... ) and outputs to a D/A converter 12, and at the same time, functions as a fourth digital filter (M taps) which removes image components generated at conversion.

The D/A converter 12 is an oversampling type D/A converter which converts the digital signal 13 outputted from the sixth digital filter 60 and having the sampling frequency of d·fs into the analog signal, and outputs to the analog signal output terminal 6.

The sixth digital filter 60 is constituted by a second memory 61, a third memory 62, a fourth memory 63, a fifth memory 64, a selector 65, a multiplier 66, an accumulator 67, a first register 68, a second register 69, a third register 70 and so on. By these component elements, the sixth digital filter 60 performs the digital filtering, which was previously done using the second decimation filter 11, first interpolation filter 16 and second interpolation filter 14 which are the second, third and fourth digital filters of the conventional example in multiple-time.

The second memory 61 stores data of the digital signal 10 which is the output of the fifth digital filter 50 as aforementioned, for the processing of the second digital filter (the conventional second decimation filter 11). The third memory 62 stores data of the digital signal input from the digital signal input terminal 5, for the processing of the third digital filter (the conventional first interpolation filter 16). The fourth memory 63 stores the accumulated result of the accumulator 67 or the processing result of the third digital filter, for the processing of the fourth digital filter (the conventional second interpolation filter 14).

The fifth memory 64 stores the filter coefficients of respective digital filters. Here, as stated previously, since the second digital filter (the conventional second decimation filter 11) and the third digital filter (the conventional first interpolation filter 16) have the same filter characteristics, these filter coefficients can be made in common. Thus, a capacity of the fifth memory 64 may be M+N words.

Although only one multiplier 66 and one accumulator 67 are provided in the sixth digital filter 60, the filtering process of the second digital filter (the conventional second decimation filter 11) is performed using the second memory 61, fifth memory 64, multiplier 66, accumulator 67 and first register 68, and connecting the second memory 61 to multiplier 66 with selector 65. The intermediate accumulation output of accumulator 67 is stored in the first register 68, and the final output is output to the digital signal output terminal 4.

The filtering process of the third digital filter (the conventional first interpolation filter 16) is performed using the third memory 62, fifth memory 64, multiplier 66, accumulator 67 and second register 69, and connecting the third memory 62 to multiplier 66 with selector 65. The intermediate accumulated result of accumulator 67 is stored in the second register 69, and the final output is output to, and stored in, the fourth memory 63.

Moreover, the filtering process of the fourth digital filter (the conventional second interpolation filter 14) is performed using the fourth memory 63, fifth memory 64, multiplier 66, accumulator 67 and third register 70, and connecting the fourth memory 63 to multiplier 66 with selector 65. The intermediate accumulated result of accumulator 67 is stored in the third register 70, and the final output is output to the D/A converter 12.

Next, the operation of the A/D-D/A converting apparatus of the present invention having the configuration as stated above is described in the following.

First, the operation of A/D conversion is described.

The analog input signal input from the analog signal input terminal 3 is converted into the digital signal 8 with a sampling frequency of a·fs by the oversampling type A/D converter 7. That is, the digital signal 8 output from A/D converter 7 is subjected to a subsampling process at the sampling frequency a·fs by the fifth digital filter 50, which is the first digital filter, and converted into the intermediate digital signal 10 at a sampling frequency cy b·fs. Thereafter, the digital signal 10 is stored temporarily in the second memory 61 of the sixth digital filter 60.

Next, by selecting the second memory 61 using the selector 65, digital data stored in the second memory 61 are given to the multiplier 66, and by the filtering process of the second digital filter using the multiplier 66, accumulator 67 and first register 68, signal components such as noise near the signal band are removed and the subsampling process of data is performed down to the final sampling frequency fs. The digital signal 13 at a sampling frequency of fs is output to the digital signal output terminal 4.

A/D conversion is performed as above.

Next, D/A conversion is described.

D/A conversion is basically the opposite of the A/D conversion. During A/D conversion, though, the conversion is performed by reducing the sampling frequency from a·fs to fs, and during D/A conversion, the conversion is performed conversely by interpolating the sampling frequency from fs to d·fs. When the sampling frequency is converted to d·fs from fs during D/A conversion, the signal passes through the digital filter to remove out-of-band signal noises, as in the case of A/D conversion.

That is, the digital signal at the sampling frequency of fs input from the digital signal input terminal 5 is stored temporarily in the third memory 62. Then, by selecting the third memory 62 with selector 65, data stored in the third memory 62 is given to multiplier 66, converted into a digital signal at a sampling frequency of c·fs by an interpolation process of the third digital filter using the multiplier 66, accumulator 67 and second register 69, and the signal is stored temporarily in the fourth memory 63.

Next, the data stored in the fourth memory 63 is given to the multiplier 66 by selecting the fourth memory using the selector 65, and after being converted into a digital signal at a sampling frequency of d·fs by interpolation by the fourth digital filter using the multiplier 66, accumulator 67 and third register 70, image noises are removed and the resulting signal is the digital signal 13. The digital signal 13 at a sampling frequency of d·fs is converted into the analog signal by the oversampling type D/A converter 12, and output from the analog signal output terminal 6 of the D/A conversion unit 2.

In the above-mentioned embodiment, though the case wherein the fifth digital filter 50 is operated as the first digital filter, and the sixth digital filter 60 is operated as the second, third and fourth digital filters is described, in the A/D converting apparatus, the fifth digital filter 50 need just be operated as the first digital filter, and in the A/D-D/A converting apparatus, the effect of reducing the circuit configuration can be obtained by operating only either of the two.

As particularly described heretofore, according to the A/D-D/A converting apparatus of the present invention, it is possible to build the digital filters in two stages instead of four, which was necessary in the past, and also it is possible to use common filter coefficient generating devices, whereby the A/D-D/A converting apparatus in which the circuit configuration is reduced considerably is realized.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within meets and bounds of the claims, or equivalence of such meets and bounds thereof are therefore intended to be embraced by the claims.

What is claimed is:

1. An analog-to-digital converting apparatus, for generating a signal of digital output samples at an output sample rate representing an input analog signal, comprising:

an analog-to-digital sampler coupled to receive the input analog signal, the assigning a digital value to the input analog signal at a given point in time, wherein said analog-to-digital sampler outputs an intermediate digital signal comprising digital samples at an initial sample rate which is higher than the output sample rate by an integer factor of A and wherein said digital value is one of a finite number of values; and an M-tap finite-impulse-response (FIR) filter, coupled at an input to receive said intermediate digital signal from said analog-to-digital sampler at said initial sample rate, which outputs the digital output signal at the output sample rate, wherein the digital output signal is said intermediate digital signal filtered according to tap coefficients of said M-tap FIR filter and decimated by a factor of A, and wherein M is a multiple of A, said M-tap FIR filter comprising:

a) an address generation means, coupled to said input of said M-tap FIR filter, for generating an address value;

b) a table look-up means, coupled to receive said address value, for outputting a stored value from a table entry addressed by said address value;

c) an accumulator coupled to received said stored value at a first input;

d) an intermediate register set, comprising M/A holding registers, each coupled to an output of said accumulator and a second input to said accumulator, wherein, when one digital value from said intermediate digital signal is input to said address generation means, said address generation means outputs an address value which addresses a table entry of said table look-up means which contains the product of said one digital value and at least one tap coefficient, and said product is accumulated by said accumulator into a holding register which accumulates a value for a sample of the digital output sample which is a function of said one digital value.

2. An M-tap finite-impulse-response (FIR) filter, which filters an input digital signal at an input sample rate into an output digital signal at an output sample rate, where the input sample rate is an integer multiple, A, of the output sample rate where M is an integer multiple of A, and where samples of the input digital signal take on one of a finite number of values, the M-tap FIR filter comprising:

a multiplying means, for outputting a product of a sample value of the input digital signal and a tap coefficient for a selected sample value and a selected one of M tap coefficients;

an intermediate register set, comprising M/A holding registers;

an accumulator coupled at a first input to receive a multiplied value from said multiplying means, coupled at a second input to a selected one of said holding registers, for outputting a sum of existing contents of said selected holding register and said multiplied value as new contents of said selected holding register, said accumulator also outputting said new contents of said selected holding register when M multiplied values are accumulated into said selected holding register, wherein said selected holding register is cleared after said outputting.

3. The filter of claim 2, wherein said multiplying means further comprises:

an address generation means, coupled to receive said sample value and a selection signal selecting at least one tap coefficient, for generating an address value unique to a combination of said sample value and said tap coefficient; and table look-up and output means, coupled to receive said address value from said address generation means, for outputting a stored value from a table entry addressed by said address value, wherein said stored value is a precomputed product of said sample value and said at least one tape coefficient.

* * * * *